United States Patent
Fukuda et al.

(10) Patent No.: US 7,347,956 B2
(45) Date of Patent: Mar. 25, 2008

(54) LUMINOUS MATERIAL FOR SCINTILLATOR COMPRISING SINGLE CRYSTAL OF YB MIXED CRYSTAL OXIDE

(75) Inventors: Tsuguo Fukuda, Miyagi (JP); Akira Yoshikawa, Miyagi (JP); Takashi Tsuzaki, Tokyo (JP)

(73) Assignee: Japan Science and Technology Agency, Kawaguchi-shi (JP)

( * ) Notice: Subject to any disclaimer, the term of this patent is extended or adjusted under 35 U.S.C. 154(b) by 321 days.

(21) Appl. No.: 10/509,425

(22) PCT Filed: Mar. 25, 2003

(86) PCT No.: PCT/JP03/03665

§ 371 (c)(1),
(2), (4) Date: Apr. 11, 2005

(87) PCT Pub. No.: WO03/080903

PCT Pub. Date: Oct. 2, 2003

(65) Prior Publication Data

US 2005/0161638 A1    Jul. 28, 2005

(30) Foreign Application Priority Data

Mar. 26, 2002 (JP) ............... 2002-086649

(51) Int. Cl.
*C09K 11/80* (2006.01)
*C09K 11/78* (2006.01)

(52) U.S. Cl. ............... 252/301.4 R; 117/945; 117/944

(58) Field of Classification Search ............ 117/945, 117/944; 252/301.4 R
See application file for complete search history.

(56) References Cited

U.S. PATENT DOCUMENTS

| | | | |
|---|---|---|---|
| 5,057,692 A | 10/1991 | Greskovich et al. | |
| 5,866,092 A * | 2/1999 | Fukuda et al. | 423/263 |
| 6,030,449 A * | 2/2000 | Fukuda et al. | 117/13 |
| 6,246,744 B1 | 6/2001 | Duclos et al. | |

OTHER PUBLICATIONS

Sablayrolles et al, "Crystal growth, luminescent and lasing properties of the ytterbium doped Li6Y(BO3)3 compound", Optical Materials, vol. 27, (11), Oct. 2005, pp. 1681-1685.*
Guerassimova et al, "X-ray excited charge transfer luminescence of ytterbium-containing aluminum garnets", Chem. Phy. Lett., 339, May 2001, pp. 197-202.*
Yoshikawa et al "{Y3-xYbx}[Ga]2(Ga)3O12 and {Lu2Yb1}{Al}2(Al)3O12 single crystals for scintillator application grown by the modified micro-pulling-down method", Nuclear Inst. and methods in Physics Res A, 486, pp. 79-82, Jun. 2002.*
Patent Abstracts of Japan, No. 04-289483, dated Oct. 14, 1992.
Patent Abstracts of Japan, No. 07-149599, dated Jun. 13, 1995.
Patent Abstracts of Japan, No. 10-001396, dated Jan. 6, 1998.

* cited by examiner

*Primary Examiner*—C. Melissa Koslow
(74) *Attorney, Agent, or Firm*—Westerman, Hattori, Daniels & Adrian, LLP.

(57) ABSTRACT

Disclosed is a luminescent material for scintillators, which comprises a single crystal of an Yb-containing mixed-crystal oxide having a base crystal consisting of a garnet single crystal or a borate single crystal. The oxide single crystal has a composition represented by either one selected from the group consisting of $R_3Al_5O_{12}$, $R_3Ga_5O_{12}$, $Li_6R(BO_3)_3$, $LaR_2Ga_3O_{12}$ and $Gd_3R_2Ga_3O_{12}$, wherein R is a mixture of Yb and either one of Y, Gd and Lu. The Yb as an element capable of forming an optically active state called CTS together with a neighboring negative ion (oxygen ion).

3 Claims, 3 Drawing Sheets

LUMINOUS MATERIAL FOR SCINTILLATOR COMPRISING SINGLE CRYSTAL OF YB MIXED CRYSTAL OXIDE

TECHNICAL FIELD

The present invention relates to a luminescent material for scintillators which comprises a single crystal of an Yb-containing mixed-crystal oxide having a base crystal consisting of a garnet single crystal or a borate single crystal.

BACKGROUND ART

Heretofore, a typical luminescent material for use as scintillators, as represented by Ce:GSO ($Gd_2SiO_5$), Ce:LSO ($Lu_2SiO_5$) or Ce:YAP ($YAlO_3$), has been based on the $5d \to 4f$ transition of Ce.

Further, patent publications disclose a Cr-activated Gd—Ga, Gd—Sc—Ga or Gd—Sc—Al garnet, a Ce or Nd-activated Y—Al garnet (Japanese Patent Laid-Open Publication No. 04-289483), a Pr-activate cubicgarnet (U.S. Pat. No. 6,246,744 B1), and a Tb-containing garnet (Japanese Patent Laid-Open Publication Nos. 07-149599 and 10-1396).

DISCLOSURE OF INVENTION

The conventional luminescent materials for scintillators have the following characteristics as primary problems to be solved.

[Concentration Quenching]

While Ce: GSO or Ce: LSO, which is used as a luminescent material for scintillators, has higher emission intensity as the content of Ce serving as a luminescent element is increased, the luminescent material based on the $5d \to 4f$ transition of Ce exhibits strong concentration quenching when the content of Ce becomes greater than 1 atomic %, and loses any scintillator effect.

[Segregation]

Ce has a large ionic radius next to La among rare-earth ions, and this excessively large ionic radius as compared to those of typical rare-earth ions (Y, Gd, Lu) in a base crystal causes a very low segregation coefficient of Ce. Consequently, the concentration of Ce is varied in a single-crystal growth direction. The resulting variation in properties becomes a major issue in application to high-accuracy PET (Positron Emission Tomography) or the like.

[Emission Wavelength]

The emission generated by the luminescent material has a short wavelength of 370 nm, and thereby it is required to use a photomultiplier tube as a photodetector. This leads to a technical limit concerning inapplicability of any semiconductor photodiode having a resolution 30 to 40 times greater than that of the photomultiplier tube.

The inventors found that a garnet or borate single crystal containing Th as a mixed-crystal component is effective as a high-accuracy scintillator, because it can generate scintillation emission based on the transition to a charge transfer state (CTS) between Yb (Ytterbium) and O (oxygen) while maintaining low concentration quenching at an Yb concentration of 40 atomic % or less to achieve enhanced brightness, and has a short luminescent-decay time at room temperature, and an emission wavelength falling within the sensitivity of the semiconductor photodiode.

Specifically, the present invention provides a luminescent material for scintillators, comprising a single crystal of an Yb-containing mixed-crystal oxide which has a composition represented by either one of $R_3Al_5O_{12}$, $R_3Ga_5O_{12}$, and $Li_6R(BO_3)_3$, wherein R is a mixture of Yb and either one of Y, Gd and Lu, and said Yb serves as an element capable of forming an optically active state called CTS together with a neighboring negative ion (oxygen ion).

The present invention further provides a luminescent material for scintillators, comprising a single crystal of an Yb-containing mixed-crystal oxide which has a composition represented by either one of $La_3R_2Ga_3O_{12}$ and $Gd_3R_2Ga_3O_{12}$, wherein R is a mixture of Yb and either one of Y, Gd and Lu, and said Yb serves as an element capable of forming an optically active state called CTS together with a neighboring negative ion (oxygen ion).

In the above luminescent material of the present invention, the molar ratio of either one of Y, Gd and Lu to Yb in the R may satisfy the conditions expressed by the following formulas:

$$1.04x + 1.02y \leq 1.03;\ x+y=1;\ 0<x<1;\ \text{and}\ 0<y<1$$

, wherein x is a molar ratio of Yb, and y is a molar ratio of either one of Y, Gd and Lu.

More specifically, the above luminescent material includes:

an aluminum garnet single crystal selected from the compound group consisting of $(Y, Yb)_3Al_5O_{12}$, $(Gd, Yb)_3Al_5O_{12}$ and $(Lu, Yb)_3Al_5O_{12}$;

a gallium garnet single crystal selected from the compound group consisting of $(Y, Yb)_3Ga_5O_{12}$, $(Gd, Yb)_3Ga_5O_{12}$ and $(Lu, Yb)_3Ga_5O_{12}$;

a borate single crystal selected from the compound group consisting of $Li_6(Y, Yb)(BO_3)_3$, $Li_6(Gd, Yb)(BO_3)_3$ and $Li_6(Lu, Yb)(BO_3)_3$;

a gallium garnet single crystal selected from the compound group consisting of $La_3(Y, Yb)_2Ga_3O_{12}$, $La_3(Gd, Yb)_2Ga_3O_{12}$ and $La_3(Lu, Yb)_2Ga_3O_{12}$; and a gallium garnet single crystal selected from the compound group consisting of $Gd_3(Y, Yb)_2Ga_3O_{12}$, $Gd_3(Gd, Yb)_2Ga_3O_{12}$ and $Gd_3(Lu, Yb)_2Ga_3O_{12}$.

BEST MODE FOR CARRYING OUT THE INVENTION

A luminescent material of the present invention selected from the compound group consisting of $(Y, Yb)_3Al_5O_{12}$, $(Gd, Yb)_3Al_5O_{12}$, $(Lu, Yb)_3Al_5O_{12}$, $(Y, Yb)_3Ga_5O_{12}$, $(Gd, Yb)_3Ga_5O_{12}$, $(Lu, Yb)_3Ga_5O_{12}$, $La_3(Y, Yb)_2Ga_3O_{12}$, $La_3(Gd, Yb)_2Ga_3O_{12}$, $La_3(Lu, Yb)_2Ga_3O_{12}$, $Gd_3(Y, Yb)_2Ga_3O_{12}$, $Gd_3(Gd, Yb)_2Ga_3O_{12}$, $Gd_3(Lu, Yb)_2Ga_3O_{12}$, $Li_6(Y, Yb)(BO_3)_3$, $Li_6(Gd, Yb)(BO_3)_3$ and $Li_6(Lu, Yb)(BO_3)_3$ has a base crystal consisting of a garnet or borate single crystal formed of an oxide of Al, Ga or B which is a group-XIII element.

These compounds contain Yb serving as an element capable of forming an optically active state called CTS together with a neighboring negative ion (oxygen ion).

Ce, Nd, Pr or Cr, which is an additive of the luminescent materials for scintillators disclosed in the patent publications described in the above "Background Art", or Yb, which is an additive for use in laser emission, forms an excited state inside the nucleus thereof.

By contrast, in the luminescent material of the present invention, the excited state corresponds to the CTS (charge transfer state) which is not formed inside the nucleus of Yb but produced by the interaction between Yb and O (oxygen), and the emission is generated through the CTS.

Figure 1:
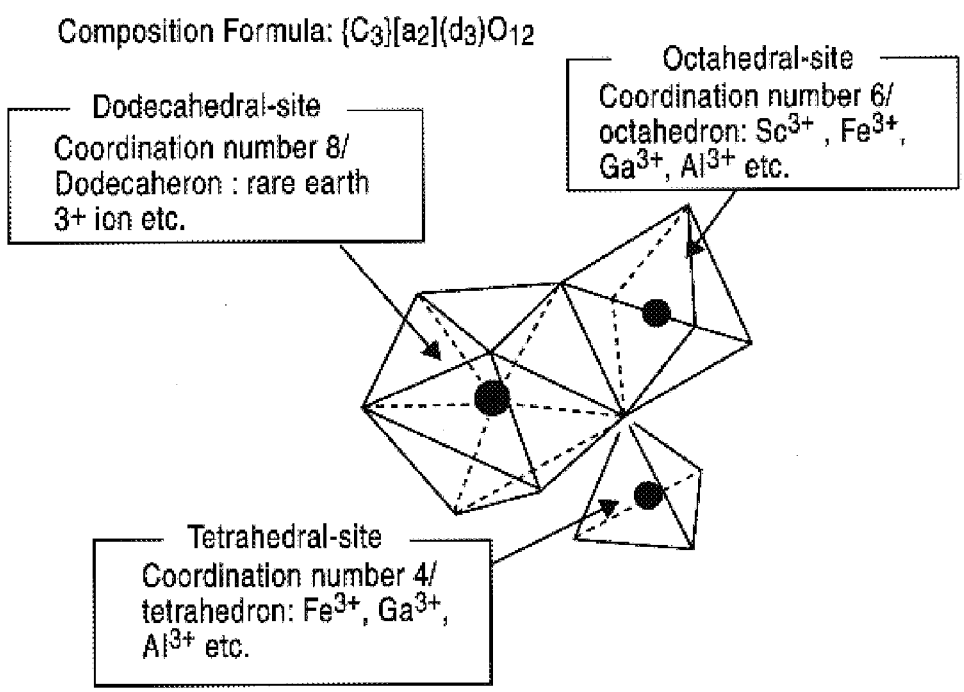
FIG. 1 is a schematic diagram showing the coordination of oxygen to positive ions, in a compound represented by the following composition formula: $\{C_3\}[a_2](d_3)O_{12}$.

FIG. 1 is a schematic diagram showing the coordination of oxygen to positive ions, in a compound represented by the following composition formula: $\{C_3\}[a_2](d_3)O_{12}$. In case of $R_3Al_5O_{12}$ or $R_3Ga_5O_{12}$, Yb is located in the dodecahedral site. In case of $La_3R_2Ga_3O_{12}$ or $Gd_3R_2Ga_3O_{12}$, Yb is located in the octahedral site, and La and Gd are located in the dodecahedral site.

Generally, the rare earth site can contain more than just one ion or up to about 1.3 ions. Thus, the molar ratio of either one of Y, Gd and Lu to Yb in the above R is set to satisfy the conditions expressed by the following formulas: $1.04x+1.02y \leq 1.03$; $x+y=1$; $0<x<1$; and $0<y<1$, wherein x is a molar ratio of Yb, and y is a molar ratio of either one of Y, Gd and Lu. The highest luminous efficiency can be obtained when $0.10<x<0.20$.

The luminescent material of the present invention can be prepared by the following single crystal growth process.

[$R_3Al_5O_{12}$ Garnet]

Yttrium oxide ($Y_2O_3$), gadolinium oxide ($Gd_2O_3$), ytterbium oxide ($Yb_2O_3$), lutetium oxide ($Lu_2O_3$) and aluminum oxide ($a-Al_{12}O_3$) which have a purity of 5N (99.999%) are used as starting materials. These starting materials are checkweighed and mixed to obtain an intended composition, and then molded and sintered to form a raw material of a luminescent material.

A single crystal is grown using a modified micro pulling-down apparatus based on high-frequency induction heating. The micro pulling-down apparatus is an unidirectional solidification/crystal growth apparatus comprising a crucible furnace, a seed holder for holding a seed crystal to be brought into contact with a molten liquid flowing out from a small hole formed in the bottom of the crucible furnace, a shift mechanism for moving the seed holder downwardly, a control unit for controlling the moving speed of the shift mechanism, and an induction-heating device for heating the crucible furnace.

The crucible furnace is made of iridium metal or iridium alloy, and an afterheater, which is a heat generator made of iridium metal or iridium alloy, is disposed around the outer periphery of the bottom of the crucible furnace. The induction-heating device is operable to adjust the heating value of the crucible furnace and the afterheater so as to control the heating temperature of the solid-liquid boundary phase of the molten liquid to be extracted from the small hole in the bottom of the crucible furnace.

In this apparatus, the small hole is provided in a plural number. The small holes are designed to have a diameter (400 µmφ or less, preferably in the range of 200 to 300 µmφ, for oxide eutectic materials) which allows an effective segregation coefficient $K_{eff}$ to be about 1 and prevents the molten liquid from dripping off therethrough, and arranged to allow the molten liquids falling from the small holes to converge or interflow before they are brought into contact with the seed crystal.

With the use of the above apparatus, the above molded/sintered raw material is put in the crucible furnace, and the air in the crucible furnace is evacuated to control the atmosphere in the furnace. Then, high-purity Ar gas (99.99%) is introduced in the furnace to form an inert gas atmosphere in the furnace, and a high-frequency power is gradually applied to a high-frequency induction-heating coil to heat the crucible furnace so as to completely melt the raw material in the crucible furnace. Preferably, the high-frequency power is continuously applied for about 2 hours to obtain homogeneity in composition of the molten liquid.

Subsequently, a crystal is grown through the following steps.

The seed crystal [YAG (Yttrium Aluminum Garnet) single crystal cleaved along the <111> direction] is gradually lifted at a given speed to bring the tip of the seed crystal into contact with the small holes formed in the bottom of the crucible furnace (and arranged to allow the molten liquids falling from the small holes to converge or interflow before they are brought into contact with the seed crystal). After the tip of the seed crystal sufficiently fits in with the small holes, a pulling-down shaft is moved downward while adjusting the temperature of the molten liquid to grow the crystal. When the entire molten liquid is consumed, and the prepared raw material is fully crystallized, the crystal growth process is completed. The crystal is gradually cooled while being held in the afterheater.

[$R_3Ga_5O_{12}$, $La_3R_2Ga_3O_{12}$ or $Gd_3R_2Ga_3O_{12}$ Garnet]

A single crystal growth process for $R_3Ga_5O_{12}$, $La_3R_2Ga_3O_{12}$ or $Gd_3R_2Ga_3O$ follows.

Lanthanum oxide ($La_2O_3$), yttrium oxide ($Y_2O_3$), gadolinium oxide ($Gd_2O_3$), ytterbium oxide ($Yb_2O_3$), lutetium oxide ($Lu_2O_3$) and gallium oxide ($b-Ga_2O_3$) which have a purity of 5N (99.999%) are used as starting materials. These starting materials are checkweighed and mixed to obtain an intended composition, and then molded and sintered to form a raw material of a luminescent material. A single crystal is grown using the aforementioned modified micro pulling-down apparatus based on high-frequency induction heating, in the same manner as that of the above process, except that a $Y_3Ga_5O_{12}$ single crystal cleaved along the <111> direction is used as a seed crystal.

[$Li_6R(BO_3)_3$ Borate]

A single crystal growth process for $Li_6R(BO_3)_3$ is performed as follows.

Boron oxide ($B_2O_3$), lithium carbonate ($Li_2CO_3$), yttrium oxide ($Y_2O_3$), gadolinium oxide ($Gd_2O_3$), ytterbium oxide ($Yb_2O_3$) and lutetium oxide ($Lu_2O_3$) which have a purity of 5N (99.999%) are used as starting materials. These starting materials are checkweighed and mixed to obtain an intended composition, and then molded and sintered to form a raw material of a luminescent material.

A single crystal is grown using the aforementioned modified micro pulling-down apparatus based on high-frequency induction heating, in the same manner as that of the above process, except that a $Li_6Y(BO_3)_3$ single crystal cleaved along the <110> direction is used as a seed crystal.

The characteristics of the luminescent material of the present invention will be described below.

[Concentration Quenching]

In the emission based on the charge transfer state (CTS) between Yb (ytterbium) and O (oxygen), the concentration-dependent quenching is not severe (it comes to the front when the content of Yb is greater than 40 atomic %) as compared to that in the emission based on the 5d→4f transition of Ce (it comes to the front when the content of Ce is greater than 1 atomic %). Thus, the luminescent material of the present invention is advantageous in obtaining enhanced brightness using a luminescent element at a high concentration.

[Segregation]

Yb has an ionic radius approximately equal to those of typical rare-earth ions (Y, Gd, Lu) in a base crystal, and thereby the segregation coefficient of Yb is close to 1. Thus, if only the conditions of crystal growth are optimized, a single crystal can be prepared without any variation in composition in the crystal growth direction. This is significantly advantageous in application to a next-generation PET requiring a high degree of accuracy.

[Emission Wavelength]

As compared to the wavelength (~370 nm) of the emission based on the 5d→4f transition of Ce, the emission based on the charge transfer state of Yb in the luminescent material of the present invention has a long wavelength of ~540 µm. Thus, a semiconductor photodiode expected to provide a resolution about 30 to 40 times greater than that of a photomultiplier tube can be used as a photodetector around the wavelength (540 µm) of maximal sensitivity thereof.

That is, a combination of the luminescent material of the present invention and the semiconductor photodiode makes it possible to achieve a high-accuracy scintillation detector, and a PET using the scintillation detector can have an enhanced resolution capable of detecting a diseased region having a size of 0.1 mm.

[Luminescent-Decay Time]

While it has been considered that scintillator crystals generating emission based on the charge transfer state is unsuitable for PET requiring a high resolution because such an emission generally has a slow decay time, the emission based on the charge transfer state of Yb has a short decay time due to temperature-dependent quenching at room temperature. A resulting light loss can be covered by the advantage of being capable of increasing the concentration of the luminescent element.

[Efficiency of Collision with Radiation]

The above single crystal serves as a scintillator crystal for converting radiation, such as γ-ray or X-ray, to visible light. It is reported that a scintillator with a higher density can absorb γ-ray or X-ray more efficiently. In this respect, Yb is a heavier element than Ce, and thereby advantageous in receiving a lager amount of radiation.

EXAMPLE

Examples 1 to 3

Table 1 shows the conditions of preparing Yb-containing mixed-crystal aluminum garnet single crystals in Examples 1 to 3 (Nos. 1 to 3).

TABLE 1

| No | Compound Composition | Starting Material | Melting Point, Atmosphere, Material of Crucible | Optimal Amount of Yb |
|---|---|---|---|---|
| 1 | $\{Y_{3-x}Yb_x\}Al_5O_{12}$<br>x = 0.15 (5%)<br>0.30 (10%)<br>0.45 (15%)<br>0.60 (20%)<br>0.90 (30%) | $Y_2O_3$ (4N)<br>$Yb_2O_3$ (4N)<br>$Al_2O_3$ (5N) | 1980° C.<br>Ar flow<br>Ir crucible | $\{Y_{2.55}Yb_{0.45}\}Al_5O_{12}$<br>Yb = 15% |
| 2 | $\{Gd_{3-x}Yb_x\}Al_5O_{12}$<br>x = 0.15 (5%)<br>0.30 (10%)<br>0.45 (15%)<br>0.60 (20%)<br>0.90 (30%) | $Gd_2O_3$ (4N)<br>$Yb_2O_3$ (4N)<br>$Al_2O_3$ (5N) | 2000° C.<br>Ar flow<br>Ir crucible | $\{Gd_{2.55}Yb_{0.45}\}Al_5O_{12}$<br>Yb = 15% |
| 3 | $\{Lu_{3-x}Yb_x\}Al_5O_{12}$<br>x = 0.15 (5%)<br>0.30 (10%)<br>0.45 (15%)<br>0.60 (20%)<br>0.90 (30%) | $Lu_2O_3$ (4N)<br>$Yb_2O_3$ (4N)<br>$Al_2O_3$ (5N) | 2050° C.<br>Ar flow<br>Ir crucible | $\{Lu_{2.55}Yb_{0.45}\}Al_5O_{12}$<br>Yb = 15% |

Figure 2:
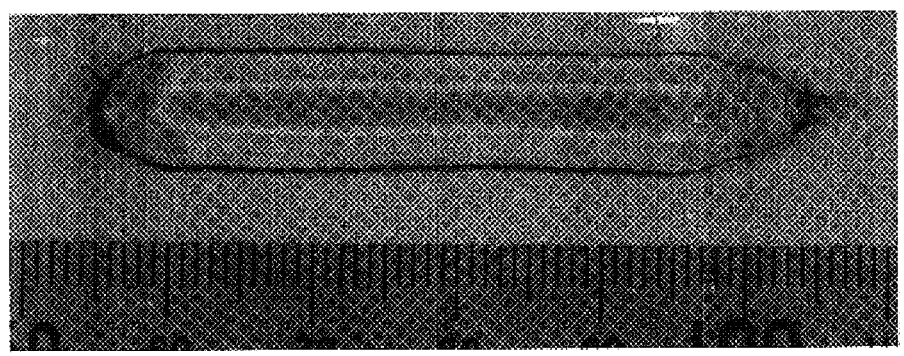
FIG. 2 is an optical photograph showing the transparency of a single crystal of $(Lu_{2.55}Yb_{0.45})Al_5O_{12}$ (Yb=15 atomic %) in Example 3.
Figure 3:
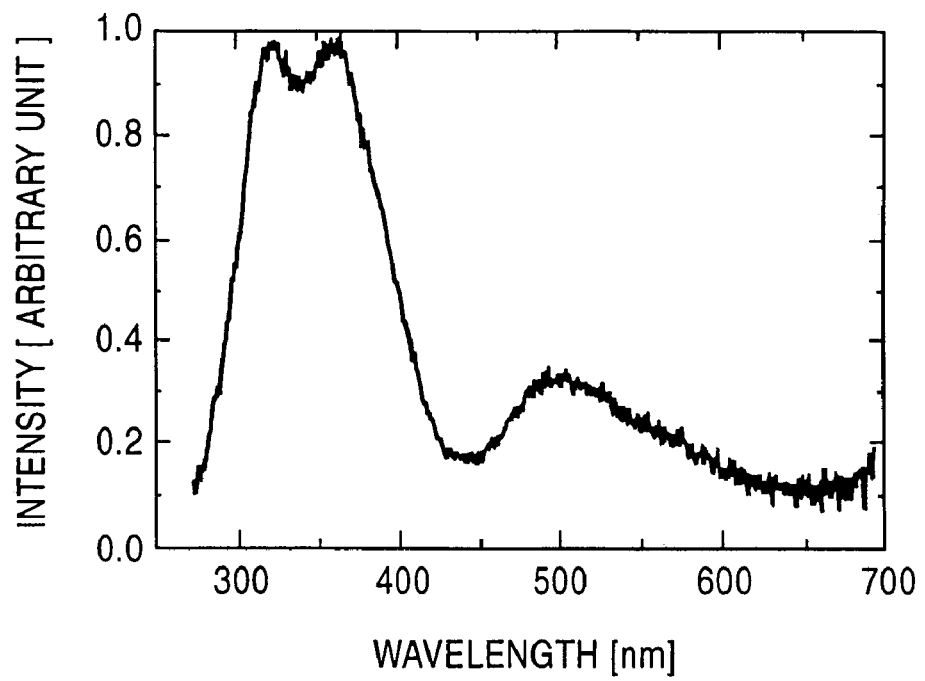
FIG. 3 is a graph showing an X-ray-excited emission spectrum of the single crystal of $(Lu_{2.55}Yb_{0.45})Al_5O_{12}$ (Yb=15 atomic %) in Example 3.
Figure 4:
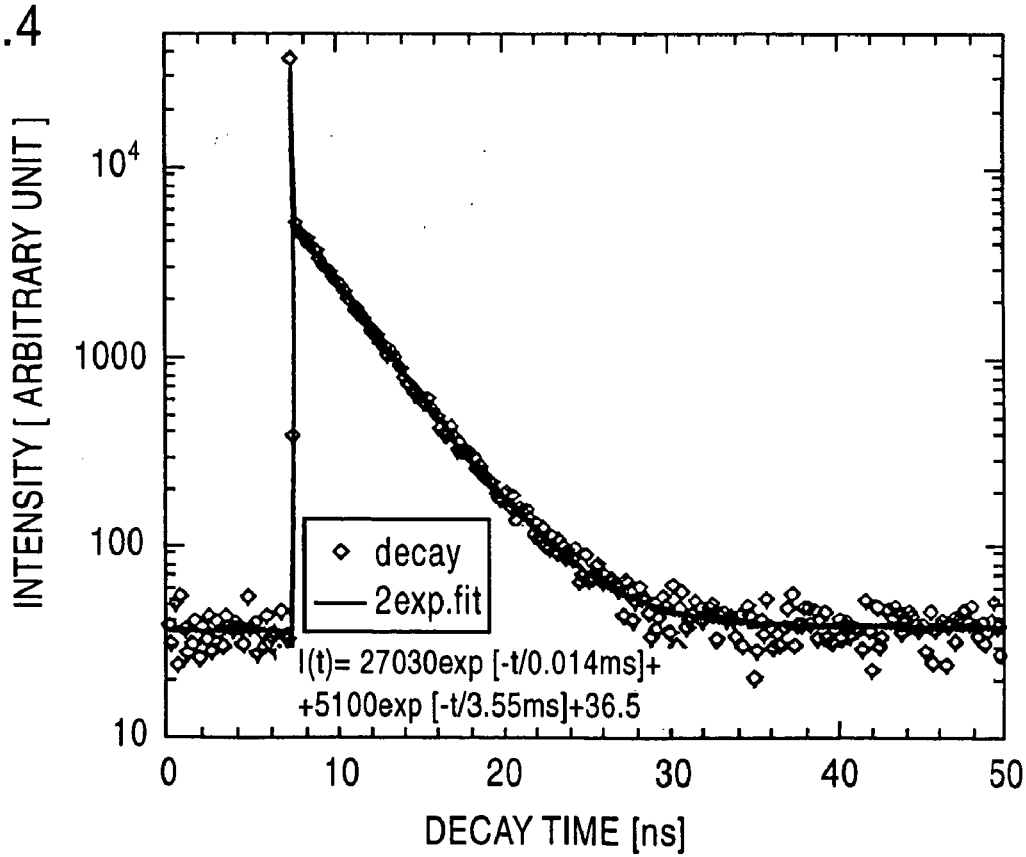
FIG. 4 is a graph showing the decay time of the single crystal of $(Lu_{2.55}Yb_{0.45})Al_5O_{12}$ (Yb=15 atomic %) in Example 3.

FIG. 2 is a photograph showing a single crystal of $\{Lu_{2.55}Yb_{0.45}\}Al_5O_{12}$ (Yb 15 atomic %) in Example 3. FIG. 3 shows an X-ray-excited emission spectrum of the single crystal. FIG. 4 shows the decay time of the single crystal. The emission spectrum in FIG. 3 shows that the rightward peak is close to the wavelength range (530 nm) of maximal sensitivity of a semiconductor photodiode. This means that a semiconductor photodiode with sensitivity about 30 to 40 times greater than that of a conventional photomultiplier tube can be used as a photodetector in combination with the single crystal. This drastically enhanced sensitivity can contribute to improvement in resolution of PET.

Examples 4 to 8

Table 2 shows the conditions of preparing Yb-containing mixed-crystal gallium garnet single crystals in Examples 4 to 8 (Nos. 4 to 8).

TABLE 2

| No | Compound Composition | Starting Material | Melting Point, Atmosphere, Material of Crucible | Optimal Amount of Yb |
|---|---|---|---|---|
| 4 | $\{Y_{3-x}Yb_x\}Ga_5O_{12}$<br>x = 0.15 (5%)<br>0.30 (10%)<br>0.45 (15%)<br>0.60 (20%)<br>0.90 (30%) | $Y_2O_3$ (4N)<br>$Yb_2O_3$ (4N)<br>$\beta\text{-}Ga_2O_3$ (4N) | 1750° C.<br>Ar + 0.2% $O_2$ flow<br>Ir crucible | $\{Y_{2.55}Yb_{0.45}\}Ga_5O_{12}$<br>Yb = 15% |
| 5 | $\{Gd_{3-x}Yb_x\}Ga_5O_{12}$<br>x = 0.15 (5%)<br>0.30 (10%)<br>0.45 (15%)<br>0.60 (20%)<br>0.90 (30%) | $Gd_2O_3$ (4N)<br>$Yb_2O_3$ (4N)<br>$\beta\text{-}Ga_2O_3$ (4N) | 1780° C.<br>Ar + 0.2% $O_2$ flow<br>Ir crucible | $\{Gd_{2.55}Yb_{0.45}\}Ga_5O_{12}$<br>Yb = 15% |
| 6 | $\{Lu_{3-x}Yb_x\}Ga_5O_{12}$<br>x = 0.15 (5%)<br>0.30 (10%)<br>0.45 (15%)<br>0.60 (20%)<br>0.90 (30%) | $Lu_2O_3$ (4N)<br>$Yb_2O_3$ (4N)<br>$\beta\text{-}Ga_2O_3$ (4N) | 1800° C.<br>Ar + 0.2% $O_2$ flow<br>Ir crucible | $\{Lu_{2.55}Yb_{0.45}\}Ga_5O_{12}$<br>Yb = 15% |
| 7 | $\{La_3\}[Lu_{2-x}Yb_x](Ga_3)O_{12}$<br>x = 0.10 (5%)<br>0.20 (10%)<br>0.30 (15%)<br>0.40 (20%)<br>0.60 (30%) | $La_2O_3$ (4N)<br>$Lu_2O_3$ (4N)<br>$Yb_2O_3$ (4N)<br>$\beta\text{-}Ga_2O_3$ (4N) | 1800° C.<br>Ar + 0.2% $O_2$ flow<br>Ir crucible | $\{La_3\}[Lu_{1.7}Yb_{0.3}](Ga_3)O_{12}$<br>Yb = 15% |
| 8 | $\{Gd_3\}[Lu_{2-x}Yb_x](Ga_3)O_{12}$<br>x = 0.10 (5%)<br>0.20 (10%)<br>0.30 (15%)<br>0.40 (20%)<br>0.60 (30%) | $Gd_2O_3$ (4N)<br>$Lu_2O_3$ (4N)<br>$Yb_2O_3$ (4N)<br>$\beta\text{-}Ga_2O_3$ (4N) | 1780° C.<br>Ar + 0.2% $O_2$ flow<br>Ir crucible | $\{Gd_3\}[Lu_{1.7}Yb_{0.3}](Ga_3)O_{12}$<br>Yb = 15% |

Examples 9 to 11

Table 3 shows the conditions of preparing Yb-containing mixed-crystal borate single crystals in Examples 9 to 11 (Nos. 9 to 11).

TABLE 3

| No | Compound Composition | Starting Material | Melting Point, Atmosphere, Material of Crucible | Optimal Amount of Yb |
|---|---|---|---|---|
| 9 | $Li_6(Y_{1-x}Yb_x)(BO_3)_3$<br>x = 0.05 (5%)<br>0.10 (10%)<br>0.15 (15%)<br>0.20 (20%)<br>0.30 (30%) | $Li_2CO_3$ (4N)<br>$Y_2O_3$ (4N)<br>$Yb_2O_3$ (4N)<br>$B_2O_3$ (4N) | 1780° C.<br>80% $N_2$ + 20% $O_2$ flow<br>Pt crucible | $Li_6(Y_{0.85}Yb_{0.15})(BO_3)_3$<br>Yb = 15% |
| 10 | $Li_6(Gd_{1-x}Yb_x)(BO_3)_3$<br>x = 0.05 (5%)<br>0.10 (10%)<br>0.15 (15%)<br>0.20 (20%)<br>0.30 (30%) | $Li_2CO_3$ (4N)<br>$Gd_2O_3$ (4N)<br>$Yb_2O_3$ (4N)<br>$B_2O_3$ (4N) | 1780° C.<br>80% $N_2$ + 20% $O_2$ flow<br>Pt crucible | $Li_6(Gd_{0.85}Yb_{0.15})(BO_3)_3$<br>Yb = 15% |
| 11 | $Li_6(Lu_{1-x}Yb_x)(BO_3)_3$<br>x = 0.05 (5%)<br>0.10 (10%)<br>0.15 (15%)<br>0.20 (20%)<br>0.30 (30%) | $Li_2CO_3$ (4N)<br>$Lu_2O_3$ (4N)<br>$Yb_2O_3$ (4N)<br>$B_2O_3$ (4N) | 1780° C.<br>80% $N_2$ + 20% $O_2$ flow<br>Pt crucible | $Li_6(Lu_{0.85}Yb_{0.15})(BO_3)_3$<br>Yb = 15% |

Figure 5:
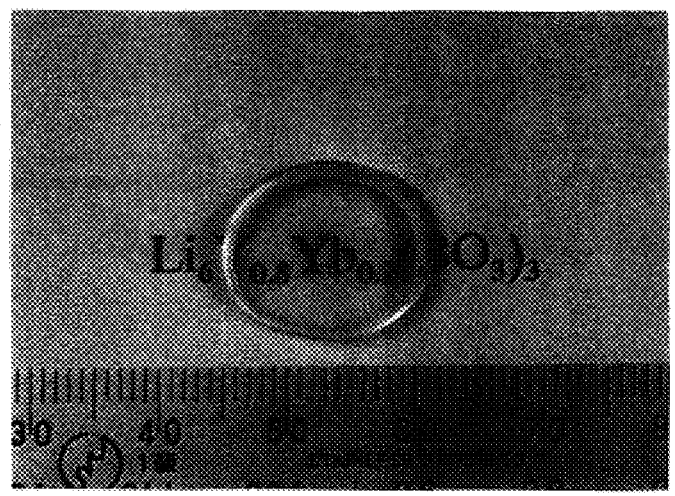
FIG. 5 is an optical photograph showing the transparency of a single crystal of $Li_6(Y_{1-x}Yb_x)(BO_3)_3$ (Yb=15 atomic %) in Example 9.
Figure 6:
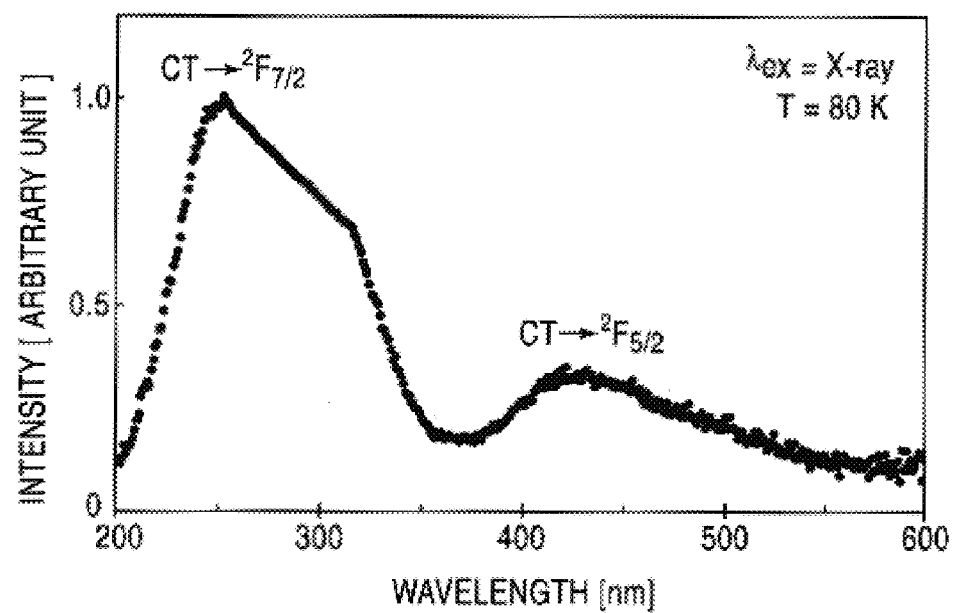
FIG. 6 is a graph showing an X-ray-excited emission spectrum of the single crystal of $Li_6(Y_{1-x}Yb_x)(BO_3)_3$ (Yb=15 atomic %) in Example 9.

FIG. 5 is a photograph showing a single crystal of $Li_6(Y_{1-x}Yb_x)(BO_3)_3$ (Yb=15 atomic %) in Example 9. FIG. 6 shows an X-ray-excited emission spectrum of the single crystal. As seen in FIG. 5, the decay time is about 30 ns. This decay time is approximately equal to that (10 to 80 ns) of Ce-doped GSO (Gadolinium Ortho-Silicate) or LSO (Lutetium Ortho-Silicate). This short decay time can also contribute to improvement in resolution of PET.

What is claimed is:

1. A luminescent material for scintillators, comprising a single crystal of an Yb-containing mixed-crystal oxide which has a composition represented by either one of $R_3Al_5O_{12}$, $R_3Ga_5O_{12}$ and $Li_6R(BO_3)_3$, wherein R is a mixture of Yb and either one of Gd and Lu, and said Yb as an element capable of forming an optically active state called CTS together with a neighboring negative ion adjacent thereto, wherein the molar ratio of either one of Gd and Lu to Yb in said R satisfies the conditions expressed by the following formulas:

$1.04x+1.02y \leq 1.03$;

$x+y=1$;

$0<x<1$; and $0<y<1$, wherein x is a molar ratio of Yb, and y is a molar ratio of either one of Gd and Lu.

2. A luminescent material for scintillators, comprising a single crystal of an Yb-containing mixed-crystal oxide which has a composition represented by either one of $La_3R_2Ga_3O_{12}$ and $Gd_3R_2Ga_3O_{12}$, wherein R is a mixture of Yb and either one of Y, Gd and Lu, and said Yb as an element capable of forming an optically active state called CTS together with a neighboring negative ion adjacent thereto, wherein the molar ratio of either one of Y, Gd and Lu to Yb in said R satisfies the conditions expressed by the following formulas:

$1.04x+1.02y \leq 1.03$;

$x+y=1$;

$0<x<1$; and $0<y<1$, wherein x is a molar ratio of Yb, and y is a molar ratio of either one of Y, Gd and Lu.

3. A luminescent material for scintillators, comprising a single crystal of an Yb-containing mixed-crystal oxide which has a composition represented by either one of $R_3Ga_5O_{12}$ and $Li_6R(BO_3)_3$, wherein R is a mixture of Yb and Y, and said Yb as an element capable of forming an optically active state called CTS together with a neighboring negative ion adjacent thereto, wherein the molar ratio of Y to Yb in said R satisfies the conditions expressed by the following formulas:

$1.04x+1.02y \leq 1.03$;

$x+y=1$;

$0<x<1$; and $0<y<1$, wherein x is a molar ratio of Yb, and y is a molar ratio of Y.

* * * * *